US010356345B2

(12) United States Patent
Hanzawa et al.

(10) Patent No.: US 10,356,345 B2
(45) Date of Patent: *Jul. 16, 2019

(54) SOLID-STATE IMAGING DEVICE, ELECTRONIC APPARATUS, AND AD CONVERTER

(71) Applicant: Sony Corporation, Tokyo (JP)

(72) Inventors: Katsuhiko Hanzawa, Kanagawa (JP); Shizunori Matsumoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/992,849

(22) Filed: May 30, 2018

(65) Prior Publication Data

US 2018/0278864 A1    Sep. 27, 2018

Related U.S. Application Data

(63) Continuation of application No. 15/831,517, filed on Dec. 5, 2017, now Pat. No. 10,015,419, which is a
(Continued)

(30) Foreign Application Priority Data

Apr. 6, 2015    (JP) ................. 2015-077902

(51) Int. Cl.
*H03K 5/08*    (2006.01)
*H03M 1/06*    (2006.01)
(Continued)

(52) U.S. Cl.
CPC .......... *H04N 5/357* (2013.01); *H01L 27/146* (2013.01); *H03K 5/08* (2013.01); *H03M 1/0678* (2013.01);
(Continued)

(58) Field of Classification Search
CPC .. H04N 5/37457; H04N 5/378; H04N 5/3745; H04N 5/37452; H04N 5/3742;
(Continued)

(56) References Cited

U.S. PATENT DOCUMENTS 6,333,658 B1    12/2001   Akita et al.
7,279,673 B2    10/2007   Kimura
(Continued)

FOREIGN PATENT DOCUMENTS

EP    2555509 A1    2/2013
JP    2001-144606 A    5/2001
(Continued)

OTHER PUBLICATIONS

International Search Report and Written Opinion and English translation thereof dated May 31, 2016 in connection with International Application No. PCT/JP2016/059087.
(Continued)

*Primary Examiner* — Chia Wei A Chen
(74) *Attorney, Agent, or Firm* — Wolf, Greenfield & Sacks, P.C.

(57) ABSTRACT

The present technology relates to a solid-state imaging device, an electronic apparatus, and an AD converter that are capable of suppressing the occurrence of an error in AD conversion results.

The solid-state imaging device includes a pixel section having a plurality of pixels, a comparator for comparing a pixel signal outputted from the pixels with a reference signal, and a counter for counting the time of comparison made by the comparator. The comparator includes a first amplifier for comparing the pixel signal with the reference signal, a second amplifier that has a first transistor and amplifies an output signal of the first amplifier, and a second transistor having the same polarity as the first transistor. A (Continued)

gate of the second transistor is connected to an output end of the first amplifier, and a source and a drain of the second transistor are connected to the same fixed potential as a source of the first transistor. The present technology is applicable, for example, to a CMOS image sensor.

32 Claims, 16 Drawing Sheets

Related U.S. Application Data continuation of application No. 15/562,643, filed as application No. PCT/JP2016/059087 on Mar. 23, 2016.

(51) Int. Cl.
| | |
|---|---|
| *H03M 1/08* | (2006.01) |
| *H03M 1/12* | (2006.01) |
| *H03M 1/34* | (2006.01) |
| *H03M 1/56* | (2006.01) |
| *H04N 5/357* | (2011.01) |
| *H04N 5/374* | (2011.01) |
| *H04N 5/378* | (2011.01) |
| *H04N 5/3745* | (2011.01) |
| *H01L 27/146* | (2006.01) |

(52) U.S. Cl.
CPC ....... *H03M 1/0845* (2013.01); *H03M 1/0863* (2013.01); *H03M 1/34* (2013.01); *H04N 5/3575* (2013.01); *H04N 5/374* (2013.01); *H04N 5/378* (2013.01); *H04N 5/37455* (2013.01); *H03M 1/123* (2013.01); *H03M 1/56* (2013.01)

(58) Field of Classification Search
CPC ............ H04N 5/3559; H01L 27/14641; H01L 27/14609
See application file for complete search history.

(56) References Cited

U.S. PATENT DOCUMENTS

| 7,541,627 | B2* | 6/2009 | Hynecek | ........... H01L 27/14647 257/224 |
|---|---|---|---|---|
| 8,223,238 | B2* | 7/2012 | Kuroda | ................ H04N 5/3741 348/280 |
| 9,521,337 | B1* | 12/2016 | Shen | ..................... H04N 5/3355 |
| 9,838,626 | B2* | 12/2017 | Nagai | ..................... H03M 1/56 |
| 9,888,199 | B2 | 2/2018 | Gomi et al. | |
| 10,015,419 | B2 | 7/2018 | Hanzawa et al. | |
| 2008/0111905 | A1 | 5/2008 | Toyama et al. | |
| 2008/0284886 | A1* | 11/2008 | Wakabayashi | ......... H04N 5/335 348/301 |
| 2009/0256611 | A1 | 10/2009 | Takahashi | |
| 2010/0091167 | A1 | 4/2010 | Azami | |
| 2010/0327935 | A1 | 12/2010 | Do | |
| 2011/0215959 | A1 | 9/2011 | Matsuzawa et al. | |
| 2011/0254986 | A1 | 10/2011 | Nishimura et al. | |
| 2011/0273601 | A1 | 11/2011 | Egawa | |
| 2013/0126710 | A1* | 5/2013 | Kondo | ............. H01L 27/14609 250/208.1 |
| 2013/0215303 | A1 | 8/2013 | Ueno | |
| 2013/0215308 | A1* | 8/2013 | Furukawa | ............... H04N 5/374 348/308 |
| 2013/0234004 | A1* | 9/2013 | Hagihara | ............... H04N 5/378 250/208.1 |
| 2014/0036120 | A1* | 2/2014 | Hagihara | ............... H04N 5/374 348/300 |
| 2014/0139713 | A1 | 5/2014 | Gomi et al. | |
| 2014/0232916 | A1* | 8/2014 | Nagai | ..................... H03M 1/56 348/302 |
| 2014/0339432 | A1 | 11/2014 | Sekine | |
| 2015/0187335 | A1* | 7/2015 | Sugiyama | ................ G09G 3/32 345/208 |
| 2015/0189209 | A1* | 7/2015 | Yang | ..................... H04N 5/378 348/300 |
| 2015/0287729 | A1 | 10/2015 | Kong et al. | |
| 2015/0341581 | A1* | 11/2015 | Saito | ..................... H04N 5/378 250/208.1 |
| 2015/0341582 | A1* | 11/2015 | Sakaguchi | ........ H01L 27/14634 348/301 |
| 2016/0057372 | A1* | 2/2016 | Iwane | ................ H04N 5/37457 348/300 |
| 2017/0309671 | A1* | 10/2017 | Sakano | ............. H01L 27/14603 |
| 2018/0109744 | A1 | 4/2018 | Hanzawa et al. | |
| 2018/0109746 | A1 | 4/2018 | Hanzawa et al. | |

FOREIGN PATENT DOCUMENTS

| JP | 2002-124858 A | 4/2002 |
|---|---|---|
| JP | 2009-253881 A | 10/2009 |
| JP | 2010-093641 A | 4/2010 |
| JP | 2014-017838 A | 1/2014 |
| WO | WO 2010/050515 A1 | 5/2010 |

OTHER PUBLICATIONS

International Preliminary Report on Patentability and English translation thereof dated Oct. 19, 2017 in connection with International Application No. PCT/JP2016/059087.
Extended European Search Report dated Aug. 20, 2018 in connection with European Application No. 16776397.8.
Chinese Office Action dated Jan. 3, 2019 in connection with Chinese Application No. 201680017405.3, and English translation thereof.
Communication pursuant to Article 94(3) dated Apr. 10, 2019 in connection with European Application No. 16776397.8.

* cited by examiner

F I G . 1 0
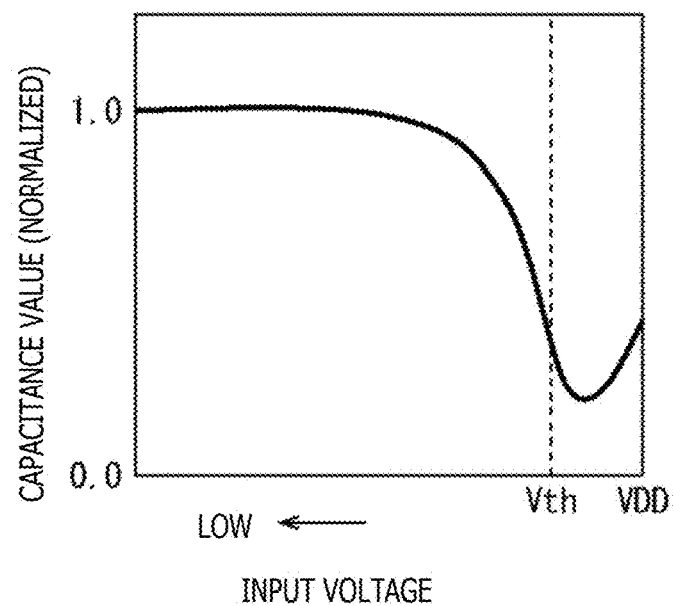

F I G . 1 4
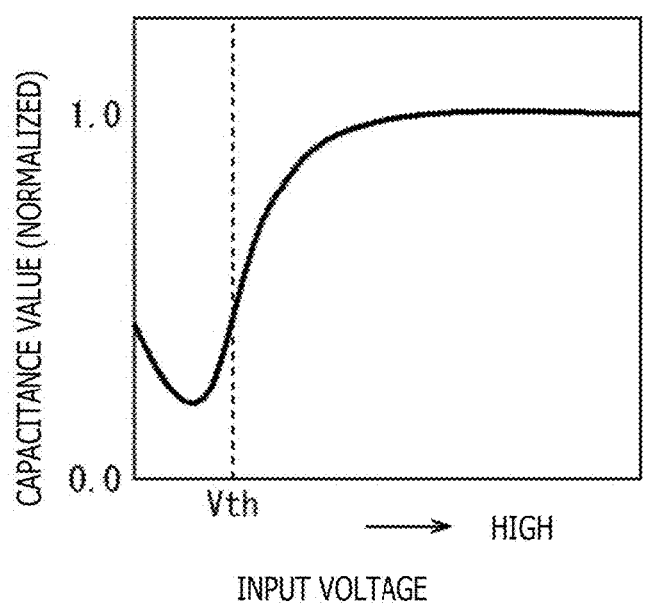

SOLID-STATE IMAGING DEVICE, ELECTRONIC APPARATUS, AND AD CONVERTER

CROSS REFERENCE TO RELATED APPLICATIONS

This application is a continuation of and claims the benefit under 35 U.S.C. § 120 of U.S. patent application Ser. No. 15/831,517, titled "SOLID-STATE IMAGING DEVICE, ELECTRONIC APPARATUS, AND AD CONVERTER," filed on Dec. 5, 2017, which is hereby incorporated by reference in its entirety. Application Ser. No. 15/831,517 is a continuation of and claims the benefit under 35 U.S.C. § 120 of U.S. patent application Ser. No. 15/562,643, titled "SOLID-STATE IMAGING DEVICE, ELECTRONIC APPARATUS, AND AD CONVERTER," filed on Sep. 28, 2017, which is hereby incorporated by reference in its entirety. Application Ser. No. 15/562,643 is a National Stage Entry of International Application No. PCT/JP2016/059087 filed on Mar. 23, 2016, which claims priority to Japanese Patent Application Number JP 2015-077902 filed in the Japanese Patent Office on Apr. 6, 2015.

TECHNICAL FIELD

The present technology relates to a solid-state imaging device, an electronic apparatus, and an analog-to-digital (AD) converter and, more particularly, to a solid-state imaging device, an electronic apparatus, and an AD converter that are capable of suppressing the occurrence of an error in AD conversion results.

BACKGROUND ART

In recent years, it is demanded that a comparator formed of a two-stage amplifier, which is used in an analog-to-digital converter (ADC), reduce noise and suppress inversion delay. The inversion delay is the elapsed time from a change in the magnitude relationship between two differential pair inputs to the inversion of an output.

The noise of the ADC can be reduced by reducing the noise of the comparator. Further, the time required for AD conversion can be shortened by suppressing the inversion delay in the comparator.

Comparator noise reduction can be achieved when a noise band is narrowed by increasing the capacitance value of a capacitor for band limitation (hereinafter referred to as the band-liming capacitor). In such an instance, however, the inversion delay increases.

Meanwhile, a comparator disclosed in PTL 1 is capable of changing the capacitance value of the band-limiting capacitor. The configuration described above makes it possible to minimize the inversion delay without changing the level of noise by decreasing the capacitance value of the band-limiting capacitor when a reference signal is tilted.

However, the configuration described in PTL 1 does not solve the trade-off between noise and inversion delay. That is to say, the inversion delay increases when the noise reduces.

PTL 2 proposes that a capacitor for producing the Miller effect be connected between the input and output of a second amplifier included in the comparator in order to solve the trade-off between noise and inversion delay. When the configuration described above is adopted, the capacitance value of the capacitor remains small before an inversion operation, but increases during the inversion operation due to the Miller effect. This makes it possible to minimize the inversion delay while reducing the noise.

CITATION LIST

Patent Literature

[PTL 1]
JP 2013-38549 A
[PTL 2]
JP 2014-17838 A

SUMMARY

Technical Problem

In the configuration described in PTL2, however, when many ADCs, such as column ADCs, simultaneously operate, supplied power fluctuates to superimpose noise over an output stage. Consequently, the AD conversion results are in error.

The present technology has been made in view of the above circumstances and suppresses the occurrence of an error in AD conversion results.

Solution to Problem

A solid-state imaging device according to an aspect of the present technology includes a pixel section, a comparator, and a counter. The pixel section includes a plurality of pixels. The comparator compares a pixel signal outputted from the pixels with a reference signal. The counter counts a time of comparison made by the comparator. The comparator includes a first amplifier, a second amplifier, and a second transistor. The first amplifier compares the pixel signal with the reference signal. The second amplifier includes a first transistor and amplifies an output signal of the first amplifier. The second transistor has the same polarity as the first transistor. A gate of the second transistor is connected to an output node of the first amplifier. A source and a drain of the second transistor are connected to the same fixed potential as a source of the first transistor.

When the second transistor is a positive-channel metal oxide semiconductor (PMOS) transistor, the source and the drain of the second transistor are connected to a power supply potential.

When the second transistor is a negative-channel metal oxide semiconductor (NMOS) transistor, the source and the drain of the second transistor are connected to a ground potential.

A threshold voltage of the second transistor is set at substantially the same level as an output signal that is generated from the first amplifier immediately before a start of inversion of the second amplifier.

An electronic apparatus according to an aspect of the present technology includes a solid-state imaging device. The solid-state imaging device includes a pixel section, a comparator, and a counter. The pixel section includes a plurality of pixels. The comparator compares a pixel signal outputted from the pixels with a reference signal. The counter counts a time of comparison made by the comparator. The comparator includes a first amplifier, a second amplifier, and a second transistor. The first amplifier compares the pixel signal with the reference signal. The second amplifier includes a first transistor and amplifies an output signal of the first amplifier. The second transistor has the same polarity as the first transistor. A gate of the second transistor is connected to an output node of the first amplifier. A source and a drain of the second transistor are connected to the same fixed potential as a source of the first transistor.

An AD converter according to an aspect of the present technology includes a comparator and a counter. The comparator compares an analog signal with a reference signal and amplifies a result of comparison. The counter counts a time of comparison made by the comparator. The comparator includes a first amplifier, a second amplifier, and a second transistor. The first amplifier compares the analog signal with the reference signal. The second amplifier includes a first transistor and amplifies an output signal of the first amplifier. The second transistor has the same polarity as the first transistor. A gate of the second transistor is connected to an output node of the first amplifier. A source and a drain of the second transistor are connected to the same fixed potential as a source of the first transistor.

According to an aspect of the present technology, in the comparator including a first amplifier for comparing a pixel signal with a reference signal, a second amplifier including a first transistor and amplifying an output signal of the first amplifier, and a second transistor having the same polarity as the first transistor, the gate of the second transistor is connected to an output node of the first amplifier, and the source and the drain of the second transistor are connected to the same fixed potential as the source of the first transistor.

Advantageous Effect of Invention

According to an aspect of the present technology, the occurrence of an error in AD conversion results can be suppressed.

BRIEF DESCRIPTION OF DRAWINGS

FIG. 10 is a diagram illustrating the capacitance characteristics of a PMOS transistor.

FIG. 14 is a diagram illustrating the capacitance characteristics of an NMOS transistor.

DESCRIPTION OF EMBODIMENTS

Embodiments of the present technology will now be described with reference to the accompanying drawings.

<Configuration of Solid-State Imaging Device>

Figure 1:
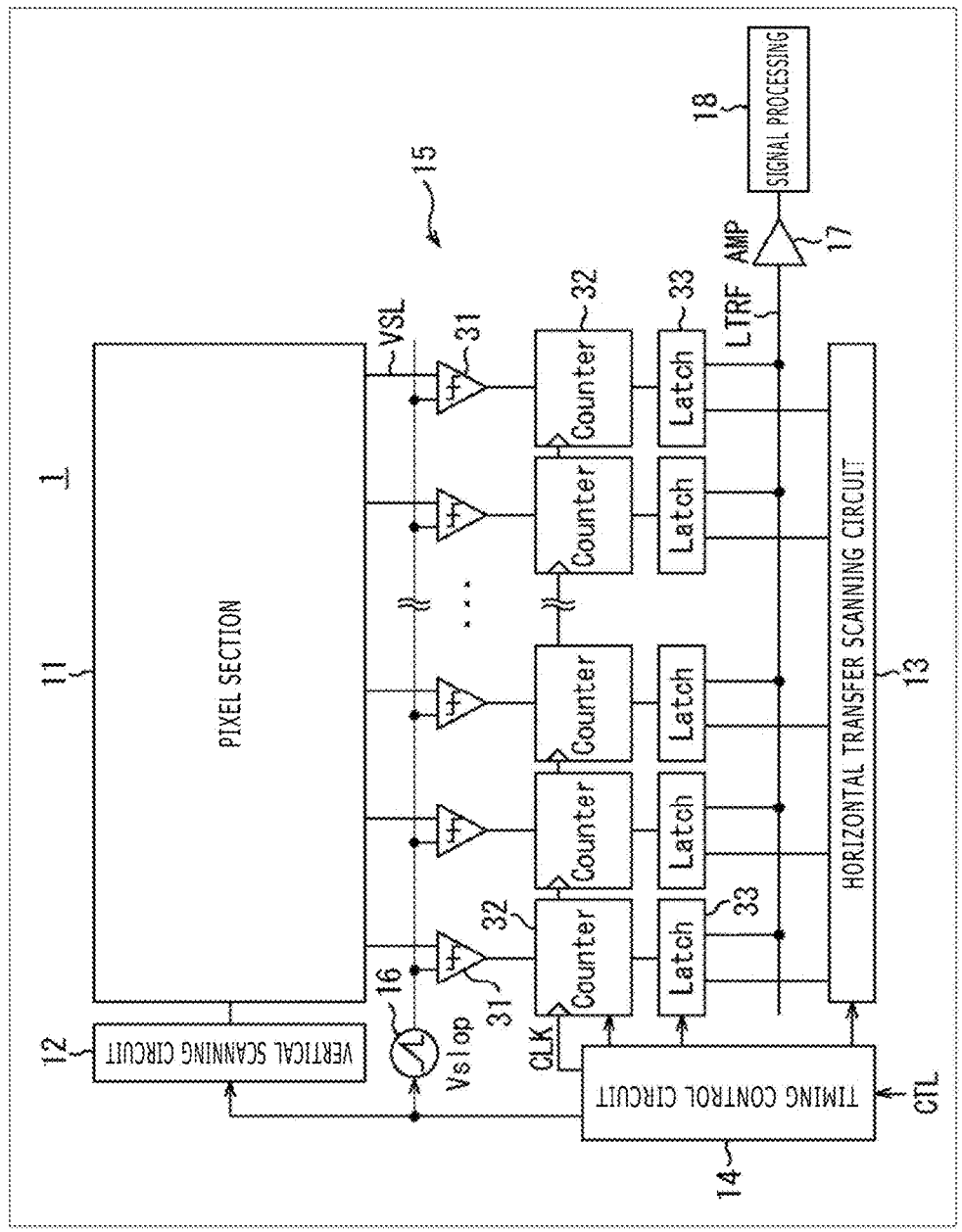
FIG. 1 is a block diagram illustrating an exemplary configuration of a solid-state imaging device according to the present technology.

FIG. 1 is a block diagram illustrating an exemplary configuration of a solid-state imaging device according to the present technology.

A solid-state imaging device 1 depicted in FIG. 1 is configured as a complementary metal oxide semiconductor (CMOS) image sensor.

The solid-state imaging device 1 includes a pixel section 11, a vertical scanning circuit 12, a horizontal transfer scanning circuit 13, a timing control circuit 14, ADCs 15, a digital-to-analog converter (DAC) 16, an amplifier circuit 17, and a signal processing circuit 18.

Among these components, the pixel section 11, the vertical scanning circuit 12, the horizontal transfer scanning circuit 13, the ADCs 15, the DAC 16, and the amplifier circuit 17 are formed of an analog circuit. The timing control circuit 14 and the signal processing circuit 18 are formed of a digital circuit.

The pixel section 11 is configured by arranging a plurality of pixels in a matrix form. A configuration of a pixel will be described later with reference to FIG. 2.

The vertical scanning circuit 12 controls row addresses and row scanning. The horizontal transfer scanning circuit 13 controls column addresses and column scanning.

The timing control circuit 14 generates an internal clock as a control circuit for sequentially reading the signals of the pixel section 11. The timing control circuit 14 generates timing signals necessary for signal processing by the pixel section 11, the vertical scanning circuit 12, the horizontal transfer scanning circuit 13, the ADCs 15, the DAC 16, and the signal processing circuit 18. The timing control circuit 14 generates a control pulse as an initialization signal that is to be applied to an initialization (auto zero (AZ)) switch (hereinafter referred to as the AZ switch). When comparators in the ADCs 15 start operating, the AZ switch is used to determine an operating point for each column.

The ADCs 15 are configured by arranging ADCs in a plurality of columns. In response to a pixel signal VSL from the pixel section 11, the ADC in each column uses a reference voltage Vslop received from the DAC 16 to perform AD conversion and digital correlated double sampling (CDS) and output a digital signal having several bits.

Each ADC includes a comparator 31, a counter 32, and a latch 33.

The comparator 31 compares the reference voltage Vslop, which is generated by the DAC 16, with the pixel signal VSL, which is acquired from pixels in each row through a vertical signal line.

The counter 32 counts the time of comparison made by the comparator 31.

The latch 33 stores the count of the counter 32. The output of each latch 33 is connected to a horizontal transfer line LTRF.

Within the ADCs 15, the comparator 31 disposed in each column compares the pixel signal VSL, which is read into the vertical signal line, with the reference voltage Vslop (a ramp signal RAMP having a ramp waveform).

In the above instance, the counter 32, which is disposed in each column as is the case with the comparator 31, operates so as to change the ramp signal RAMP and the count in a one-to-one correspondence. This converts the pixel signal VSL to a digital signal.

When the pixel signal VSL intersects the ramp signal RAMP, the output of the comparator 31 inverts and an input clock for the counter 32 stops or a stopped input clock enters the counter 32. AD conversion is then complete.

After the end of an AD conversion period, the horizontal transfer scanning circuit 13 transfers data stored in the latch 33 to the horizontal transfer line LTRF. The transferred data is then inputted to the signal processing circuit 18 through the amplifier circuit 17 and subjected to predetermined signal processing. As a result, a two-dimensional image is generated.

<Exemplary Configuration of Pixel>

Figure 2:
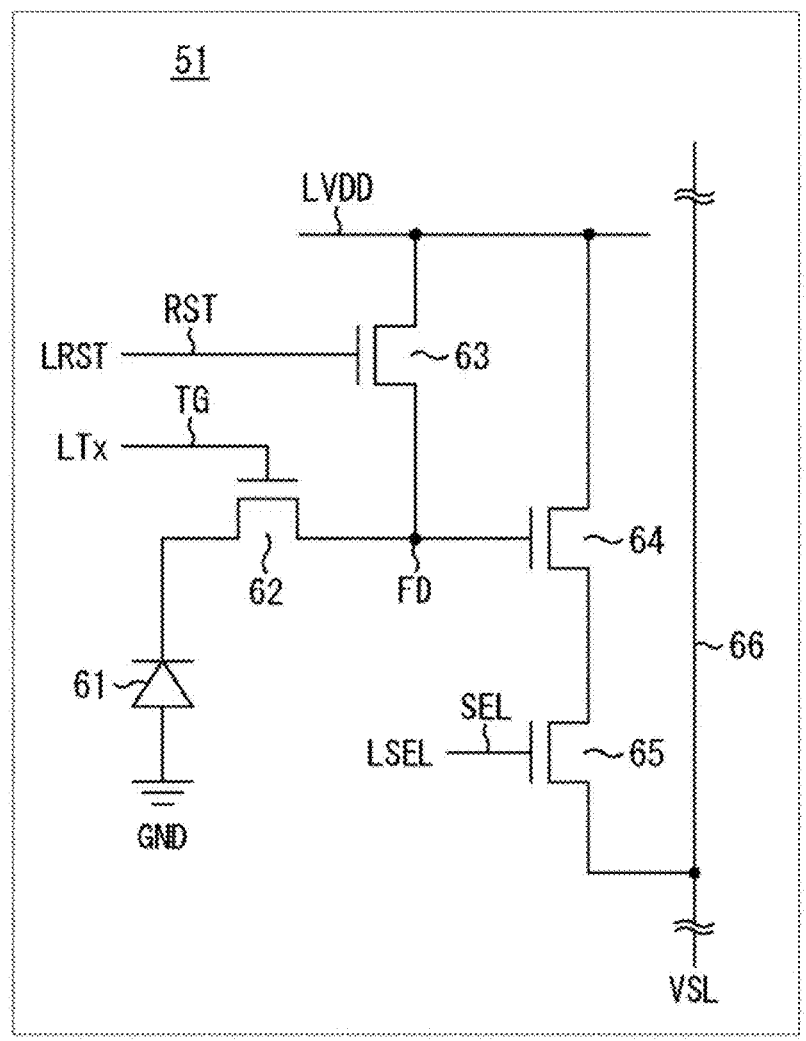
FIG. 2 is a diagram illustrating an exemplary configuration of a pixel.

FIG. 2 is a diagram illustrating an exemplary configuration of a pixel that is included in the pixel section 11 of the solid-state imaging device 1.

A pixel 51 includes a photodiode 61, a transfer transistor 62, a reset transistor 63, an amplifying transistor 64, and a selection transistor 65.

The photodiode 61 photoelectrically converts incident light to generate an electrical charge (electrons in this case) in accordance with the amount of incident light.

The transfer transistor 62 is connected between the photodiode 61 and a floating diffusion (FD) acting as an output node. When a drive signal TG is given to the gate of the transfer transistor 62 through a transfer control line LTx, the transfer transistor 62 transfers the electrons, which are photoelectrically converted by the photodiode 61, to the FD.

The reset transistor 63 is connected between a power supply line LVDD and the FD. When a drive signal RST is given to the gate of the reset transistor 63 through a reset control line LRST, the reset transistor 63 resets the potential of the FD to the potential of the power supply line LVDD.

The FD is connected to the gate of the amplifying transistor 64. The amplifying transistor 64 is connected to a vertical signal line 66 through the selection transistor 65 in order to form a source follower with a constant current source (not depicted).

When a control signal SEL is given to the gate of the selection transistor 65 through a selection control line LSEL, the selection transistor 65 turns on. When the selection transistor 65 turns on, the amplifying transistor 64 amplifies the potential of the FD, and outputs a voltage to the vertical signal line 66 in accordance with the amplified potential. A voltage (pixel signal VSL) outputted from each pixel 51 through the vertical signal line 66 is inputted to the ADCs 15.

The reset control line LRST, the transfer control line LTx, and the selection control line LSEL are wired in each row of a pixel array and driven by the vertical scanning circuit 12.

That is to say, as the gates of the transfer transistor 62, the reset transistor 63, and the selection transistor 65 are connected in each row, the above-described operation is performed simultaneously for the pixels 51 in each row.

<Exemplary Configuration of Comparator>

The comparator 31 according to the present embodiment mainly includes a first amplifier and a second amplifier. The first and second amplifiers are cascaded.

Prior to the explanation of a configuration of the comparator 31 according to the present embodiment, a configuration of an existing comparator will now be described.

(Configuration 1 of Existing Comparator)

Figure 3:
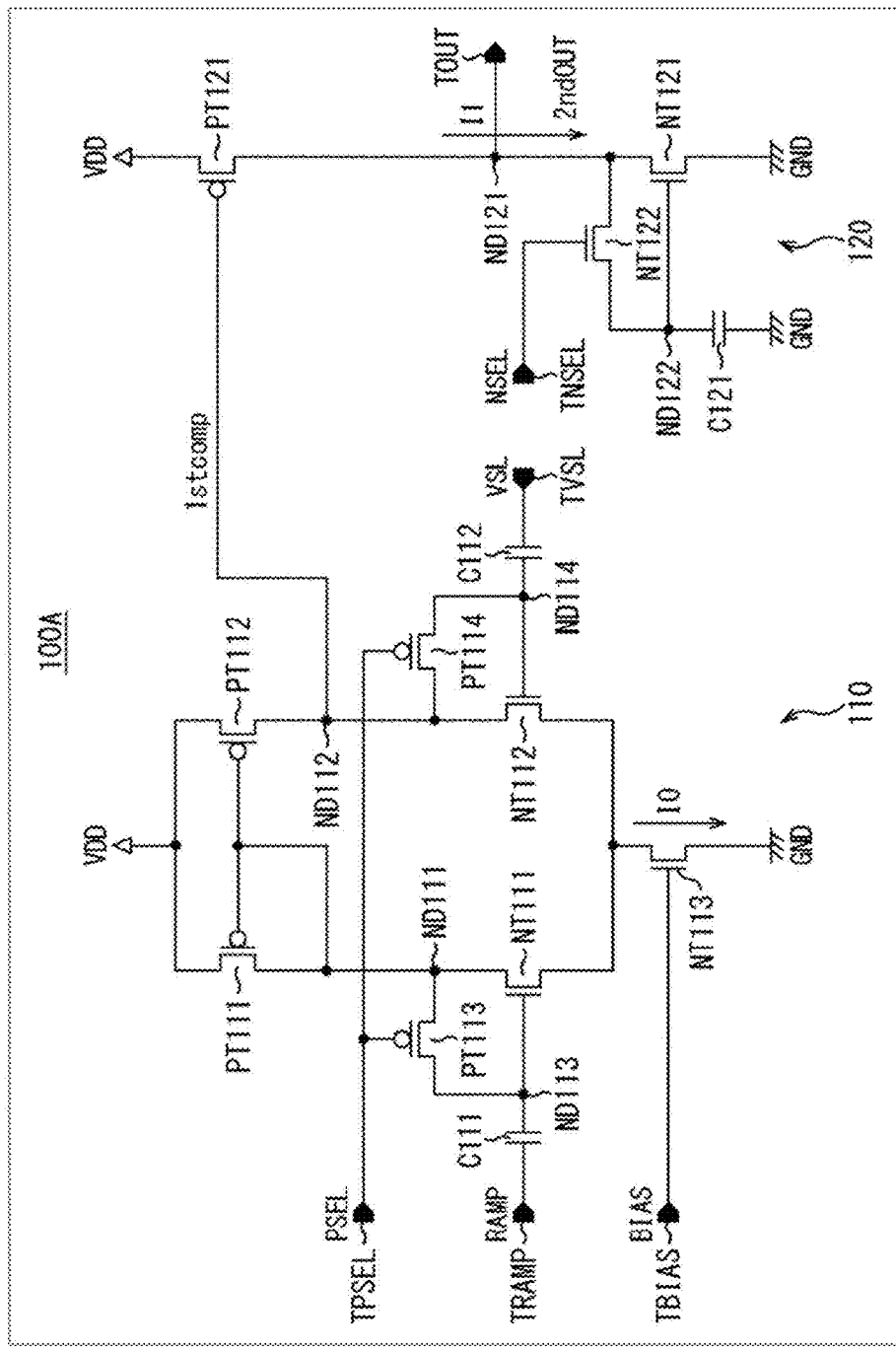
FIG. 3 is a circuit diagram illustrating an exemplary configuration of an existing comparator.

FIG. 3 is a circuit diagram illustrating an exemplary configuration of an existing comparator.

As depicted in FIG. 3, a comparator 100A includes a first amplifier 110 and a second amplifier 120. The first amplifier 110 and the second amplifier 120 are cascaded. The first amplifier 110 compares the pixel signal VSL with the reference signal Vslop (ramp signal RAMP). The second amplifier 120 amplifies the output signal of the first amplifier 110.

The first amplifier 110 includes p-channel MOS (PMOS) transistors PT111 to PT114, n-channel MOS (NMOS) transistors NT111 to NT113, and capacitors C111 and C112.

The source of the PMOS transistor PT111 and the source of the PMOS transistor PT112 are connected to a power supply potential VDD.

The drain of the PMOS transistor PT111 is connected to the drain of the NMOS transistor NT111, and the point of such connection forms a node ND111. Further, the drain and the gate of the PMOS transistor PT111 are connected, and the point of such connection is connected to the gate of the PMOS transistor PT112.

The drain of the PMOS transistor PT112 is connected to the drain of the NMOS transistor NT112, and the point of such connection forms an output node ND112 of the first amplifier 110. The source of the NMOS transistor NT111 is connected to the source of the NMOS transistor NT112, and the point of such connection is connected to the drain of the NMOS transistor NT113. The source of the NMOS transistor NT113 is connected to a reference potential (e.g., ground potential) GND.

The gate of the NMOS transistor NT111 is connected to a first electrode of the capacitor C111, and the point of such connection forms a node ND113. A second electrode of the capacitor C111 is connected to an input terminal TRAMP of the ramp signal RAMP.

The gate of the NMOS transistor NT112 is connected to a first electrode of the capacitor C112, and the point of such connection forms a node ND114. A second electrode of the capacitor C112 is connected to an input terminal TVSL of the pixel signal VSL.

Further, the gate of the NMOS transistor NT113 is connected to an input terminal TBIAS of a bias signal BIAS.

The source of the PMOS transistor PT113 is connected to the node ND111, and the drain of the PMOS transistor PT113 is connected to the node ND113. The source of the PMOS transistor PT114 is connected to the node ND112, and the drain of the PMOS transistor PT114 is connected to the node ND114.

Meanwhile, the gates of the PMOS transistors PT113 and PT114 are both connected to an input terminal TPSEL of a first AZ signal PSEL. The first AZ signal PSEL is active low.

In the first amplifier 110, a current mirror circuit is formed by the PMOS transistors PT111 and PT112, and a differential comparison section (differential pair) is formed by the NMOS transistors NT111 and NT112. The differential comparison section uses the NMOS transistor NT113 as a current source.

Further, the PMOS transistors PT113 and PT114 function as an AZ switch, and the capacitors C111 and C112 function as an AZ level sampling capacitor.

The output signal 1stcomp of the first amplifier 110 is outputted from the output node ND112 to the second amplifier 120.

The second amplifier 120 includes a PMOS transistor PT121, NMOS transistors NT121 and NT122, and a capacitor C121.

The source of the PMOS transistor PT121 is connected to the power supply potential VDD, and the gate of the PMOS transistor PT121 is connected to the output node ND112 of the first amplifier 110.

The drain of the PMOS transistor PT121 is connected to the drain of the NMOS transistor NT121, and the point of such connection forms an output node ND121.

The source of the NMOS transistor NT121 is connected to the ground potential GND, the gate of the NMOS transistor NT121 is connected to a first electrode of the capacitor C121, and the point of such connection forms a node ND122. A second electrode of the capacitor C121 is connected to the ground potential GND.

The drain of the NMOS transistor NT122 is connected to the node ND121, and the source of the NMOS transistor NT122 is connected to the node ND122.

Meanwhile, the gate of the NMOS transistor NT122 is connected to an input terminal TNSEL of a second AZ signal NSEL. The second AZ signal NSEL is active high.

The level of the second AZ signal NSEL is complimentary with respect to the level of the first AZ signal PSEL, which is supplied to the first amplifier 110.

In the second amplifier 120, the PMOS transistor PT121 forms an input end and an amplifier circuit.

Further, the NMOS transistor NT122 functions as the AZ switch, and the capacitor C121 functions as an AZ level sampling capacitor.

The output signal 2ndOUT of the second amplifier 120 is outputted from the output node ND121 to an output terminal TOUT of the comparator 100A.

(Operation 1 of Comparator)

An operation of the comparator 100A depicted in FIG. 3 will now be described with reference to the timing diagram of FIG. 4.

Although a detailed description is omitted here, reset-level integrating AD conversion (P-phase) starts at the end of an AZ period.

In the P-phase, the comparison between the ramp signal RAMP and the pixel signal VSL starts in response to changes in the ramp waveform of the ramp signal RAMP. After the ramp signal RAMP intersects the pixel signal VSL, the output signal 1stcomp of the first amplifier 110 changes sharply.

When the output signal 1stcomp of the first amplifier 110 reaches a level (inversion start voltage Vstart) at which the output signal 2ndOUT of the second amplifier 120 starts to invert, the PMOS transistor PT121 of the second amplifier 120 turns on. When the PMOS transistor PT121 turns on, a current I1 starts to flow, causing the output signal 2ndOUT of the second amplifier 120 to invert from the low level (L) to the high level (H).

In signal-level integrating AD conversion (D-phase), too, the comparator 100A operates in the same manner as in the P-phase. Consequently, as a result of digital CDS, kTC noise and comparator offset can be canceled.

Figure 4:
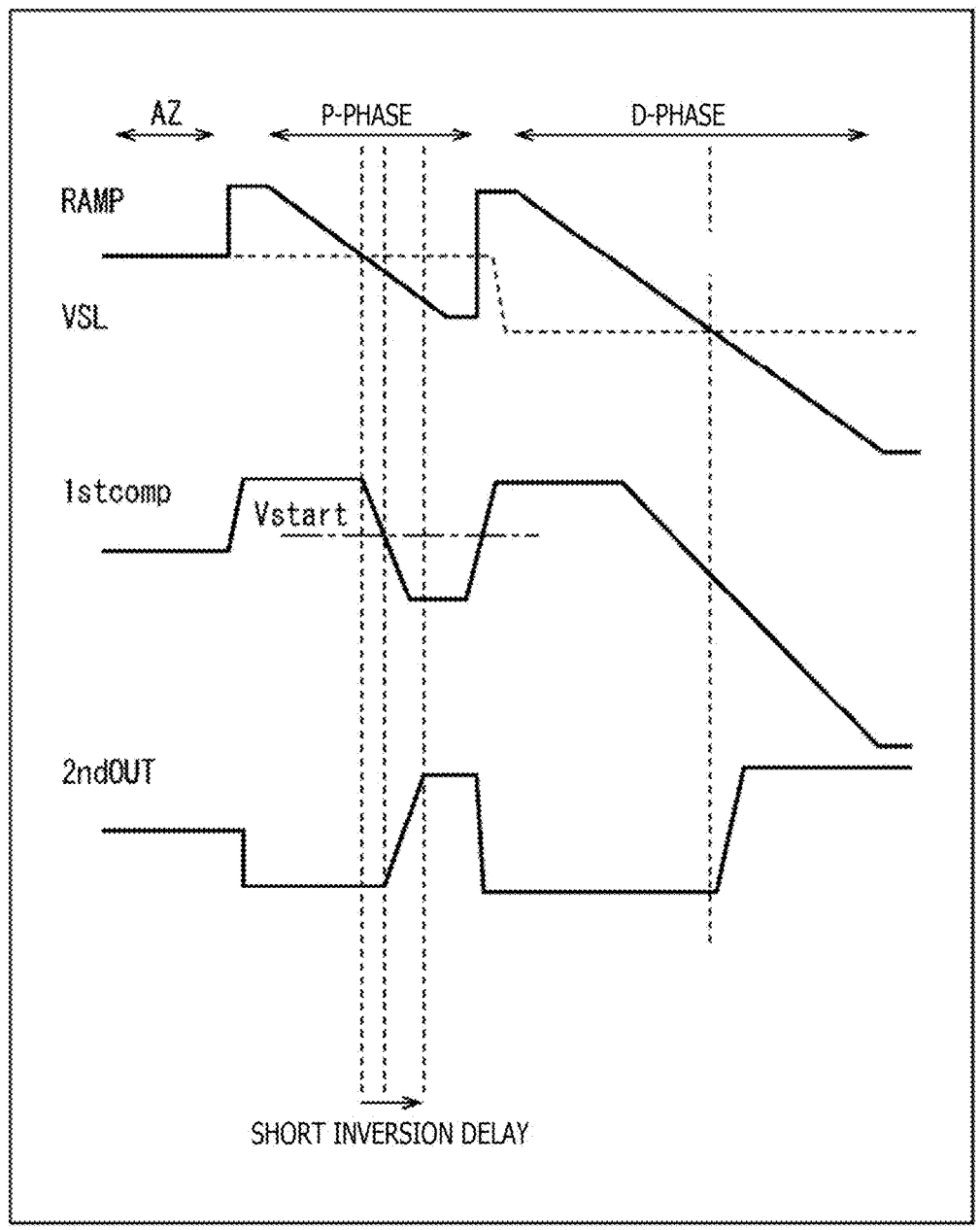
FIG. 4 is a timing diagram illustrating an operation of the comparator depicted in FIG. 3.

As depicted in FIG. 4, inversion delay in the comparator 100A is relatively reduced. However, while the output signal 2ndOUT of the second amplifier 120 is changing, the slope of change in the output signal 1stcomp of the first amplifier 110 is great. Consequently, noise reduction is unachievable due to increased bandwidth.

In view of the above circumstances, the following describes a configuration in which a band-limiting capacitor is included for noise reduction.

(Configuration 2 of Existing Comparator)

Figure 5:
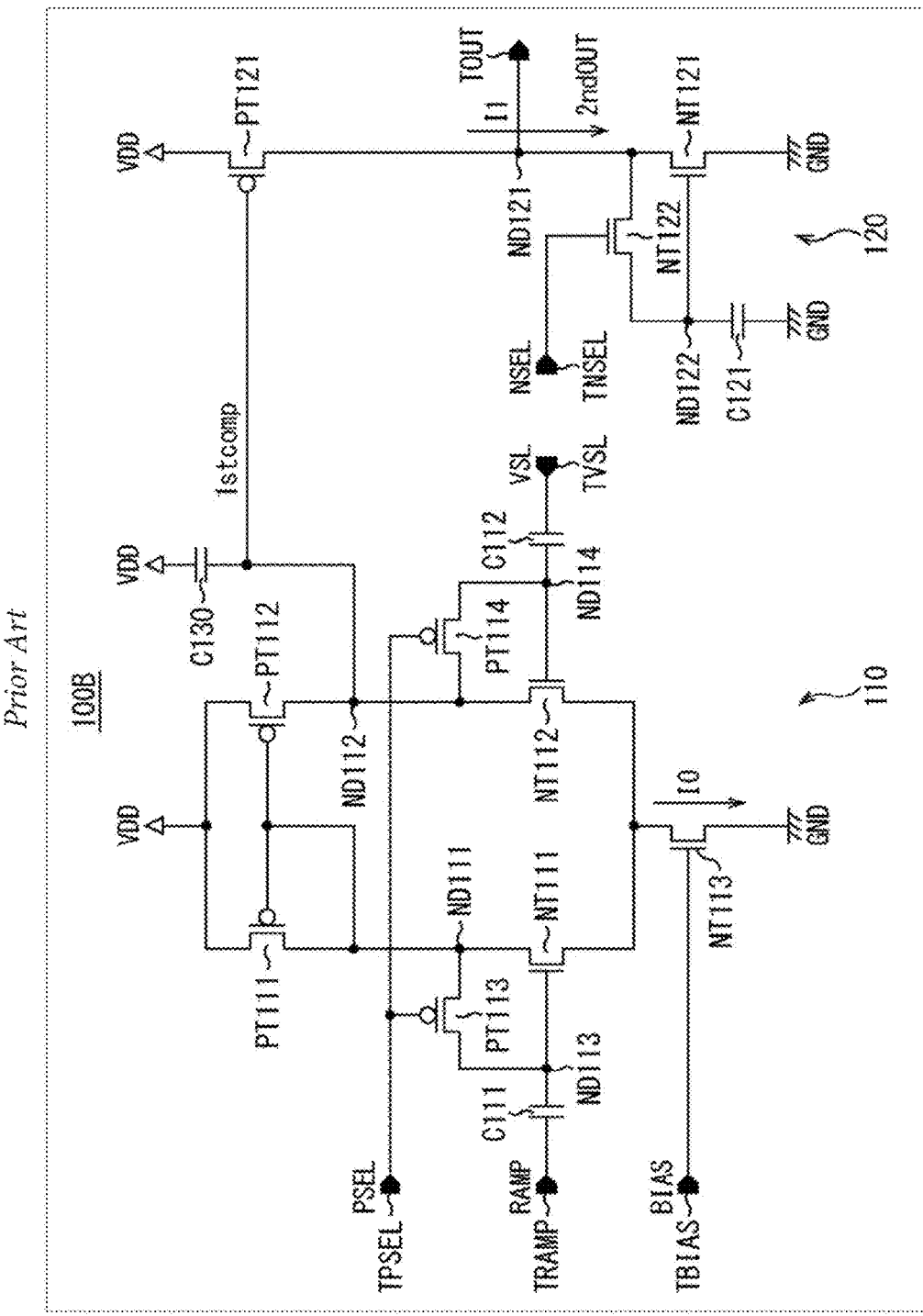
FIG. 5 is a circuit diagram illustrating another exemplary configuration of an existing comparator.

FIG. 5 is a circuit diagram illustrating another exemplary configuration of an existing comparator.

A comparator 100B depicted in FIG. 5 has basically the same configuration as the comparator 100A depicted in FIG. 3. However, the comparator 100B differs from the comparator 100A in that the comparator 100B additionally includes a band-limiting capacitor C130 between the output node ND112 of the first amplifier 110 and the power supply potential VDD.

(Operation 2 of Comparator)

Figure 6:
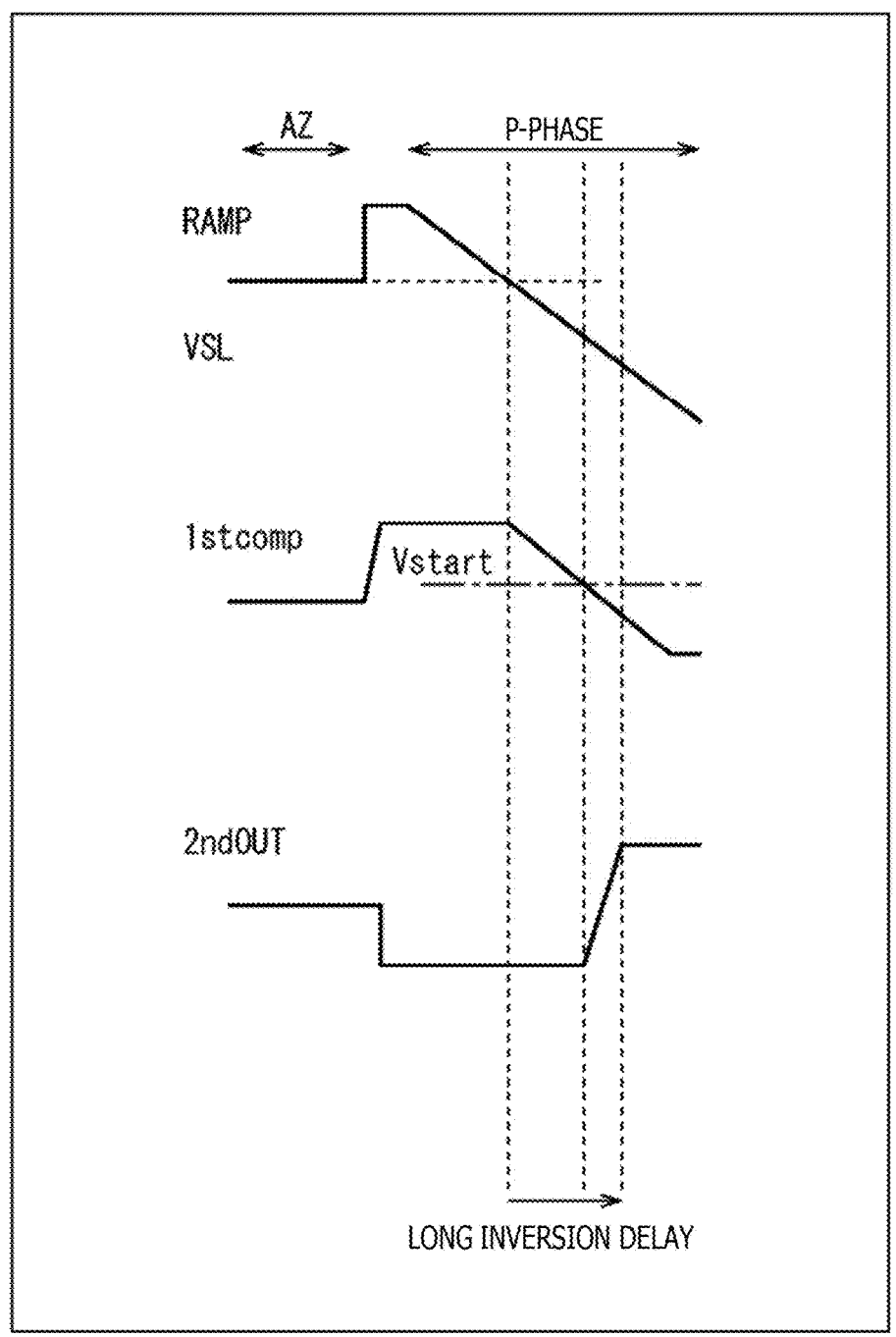
FIG. 6 is a timing diagram illustrating an operation of the comparator depicted in FIG. 5.

FIG. 6 is a timing diagram illustrating an operation of the comparator 100B depicted in FIG. 5.

FIG. 6 does not depict a timing diagram of a D-phase period, but depicts a timing diagram of the AZ period and a P-phase period.

As depicted in FIG. 6, the slope of change in the output signal 1stcomp of the first amplifier 110 is decreased by incorporating the band-limiting capacitor C130 into the comparator 100B. This decreases the bandwidth and reduces noise. However, the inversion delay increases.

In view of the above circumstances, the following describes a configuration in which a capacitor for producing the Miller effect is connected between the input and output of the second amplifier in order to solve the above-described trade-off between noise and inversion delay.

(Configuration 3 of Existing Comparator)

Figure 7:
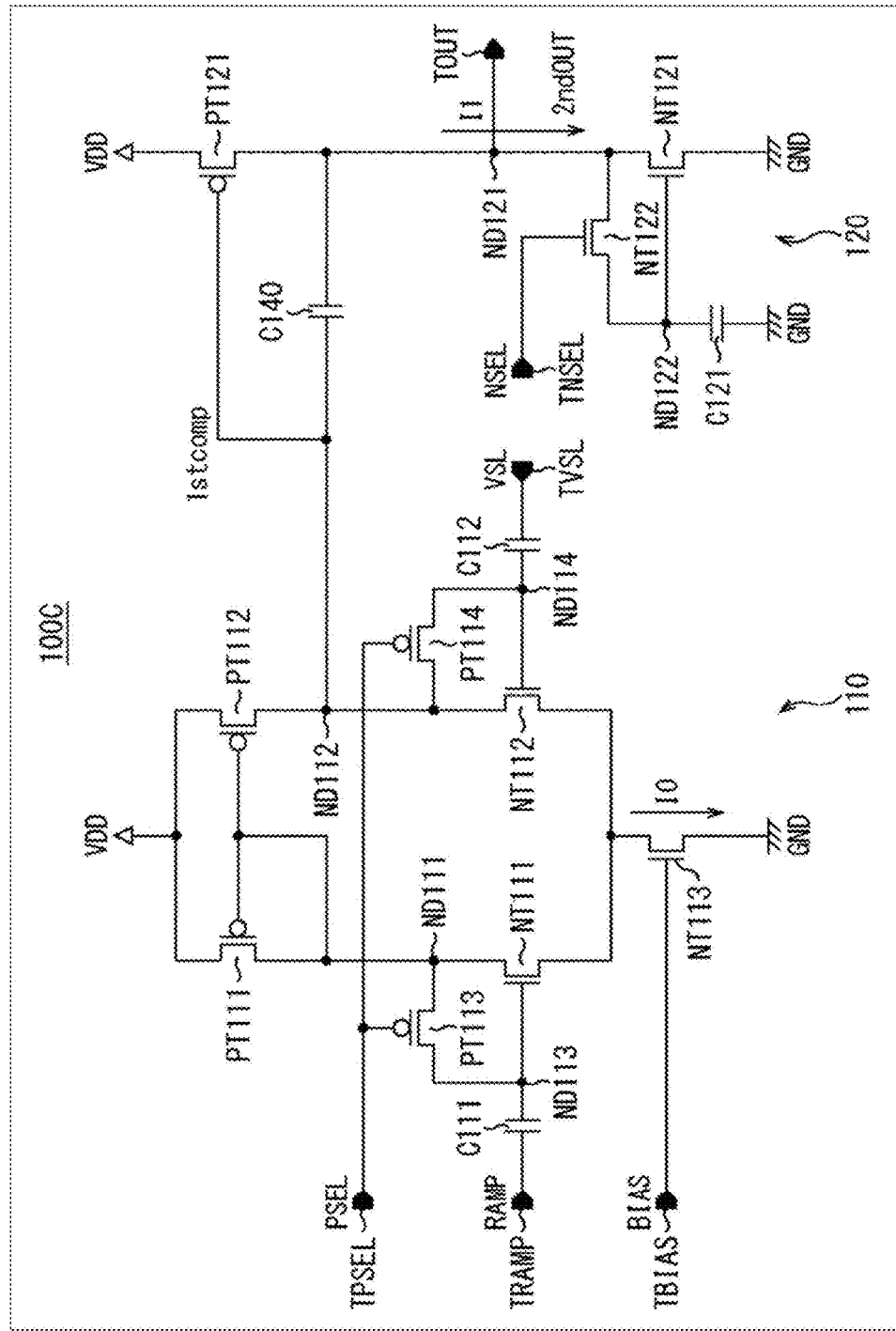
FIG. 7 is a circuit diagram illustrating yet another exemplary configuration of an existing comparator.

FIG. 7 is a circuit diagram illustrating yet another exemplary configuration of an existing comparator.

A comparator 100C depicted in FIG. 7 has basically the same configuration as the comparator 100A depicted in FIG. 3. However, the comparator 100C differs from the comparator 100A in that the comparator 100C additionally includes a capacitor C140 between the input and output of the second amplifier 120.

(Operation 3 of Comparator)

Figure 8:
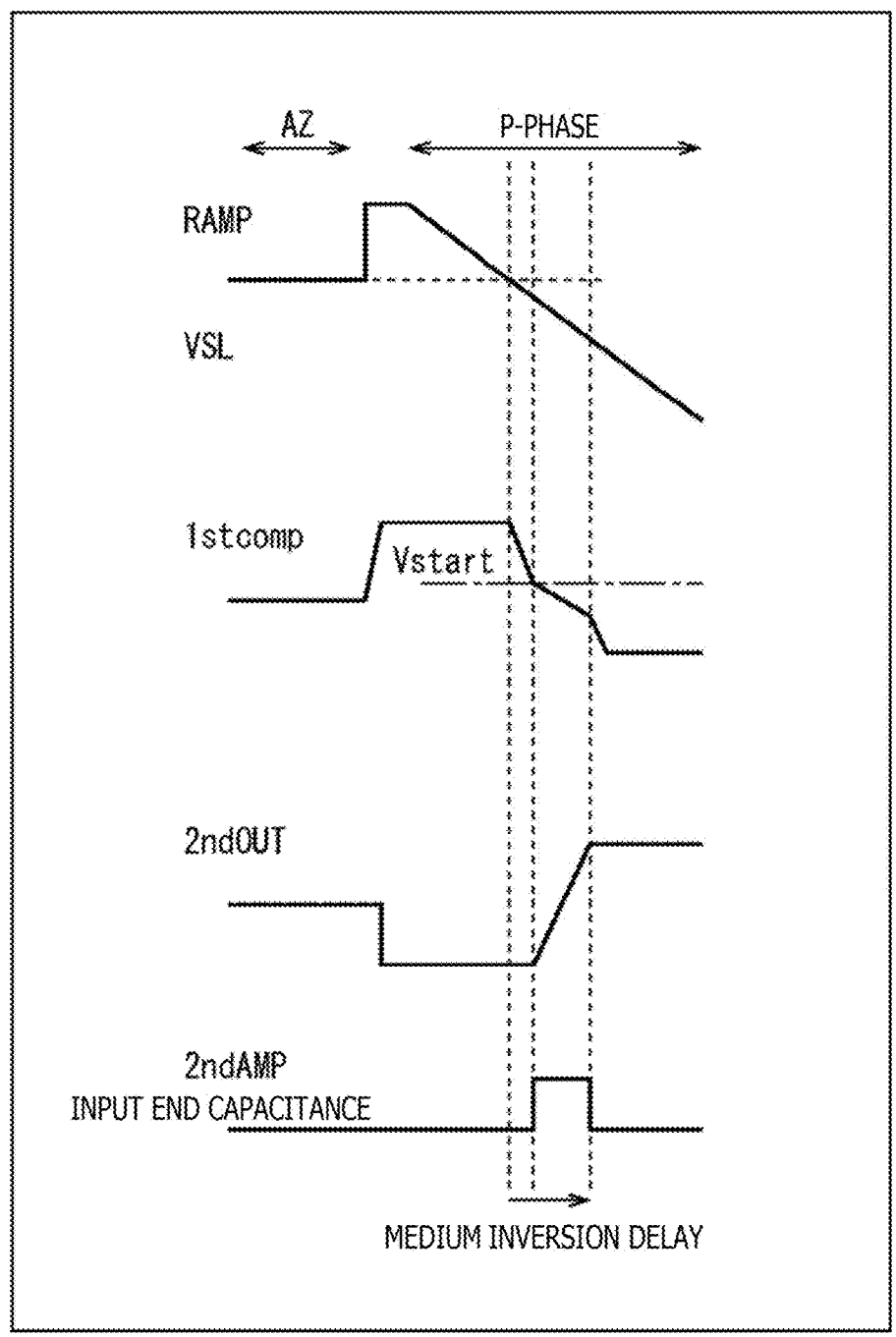
FIG. 8 is a timing diagram illustrating an operation of the comparator depicted in FIG. 7.

FIG. 8 is a timing diagram illustrating an operation of the comparator 100C depicted in FIG. 7.

FIG. 8 also does not depict a timing diagram of the D-phase period, but depicts a timing diagram of the AZ period and the P-phase period.

As depicted in FIG. 8, the Miller effect is produced by incorporating the capacitor C140 into the comparator 100C. Due to the Miller effect, the capacitance value of the capacitor C140 (an effective capacitance value at the input end of the second amplifier 120) increases only when the output signal 2ndOUT of the second amplifier 120 is changing. This suppresses an increase in the inversion delay while reducing the noise.

A configuration of the comparator 31 according to the present technology will now be described.

<Configuration of Comparator according to Present Technology>

Figure 9:
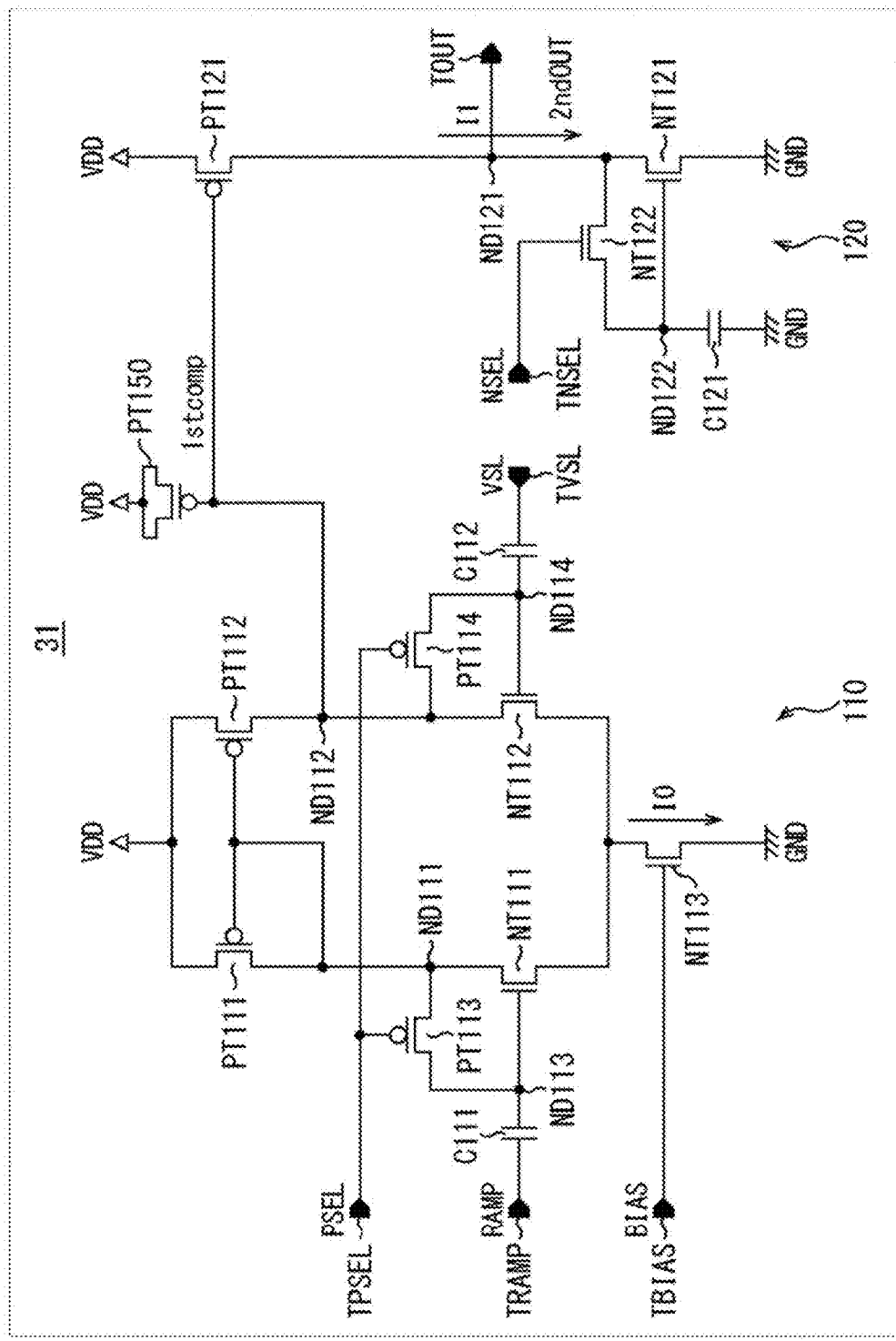
FIG. 9 is a circuit diagram illustrating an exemplary configuration of a comparator according to the present technology.

FIG. 9 is a circuit diagram illustrating an exemplary configuration of the comparator according to the present technology.

The comparator 31 has basically the same configuration as the comparator 100A depicted in FIG. 3. However, the comparator 31 differs from the comparator 100A in that the comparator 31 additionally includes a PMOS transistor PT150 as a band-limiting capacitor between the output node ND112 of the first amplifier 110 and the power supply potential VDD.

The PMOS transistor PT150 has an opposite polarity to the differential pair that is formed by the NMOS transistors NT111 and NT112 in the first amplifier 110. That is to say, the PMOS transistor PT150 has the same polarity as the PMOS transistor PT121, which acts as the input end of the second amplifier 120.

The gate of the PMOS transistor PT150 is connected to the output node ND112 of the first amplifier 110. The source and the drain of the PMOS transistor PT150 are connected to the power supply potential VDD.

FIG. 10 is a diagram illustrating the capacitance characteristics of a PMOS transistor.

As depicted in FIG. 10, the capacitance value of the PMOS transistor is small when the input voltage is high, that is, when the gate-source voltage Vgs is low. However, when the input voltage is lowered to let the gate-source voltage Vgs exceed a threshold voltage Vth, the capacitance value of the PMOS transistor sharply increases.

The above characteristics and a high-to-low level change in the output signal 1stcomp of the first amplifier 110 can be used to increase the capacitance value of the band-limiting capacitor at approximately the beginning of inversion of the output signal 2ndOUT from the second amplifier 120. In this instance, the threshold voltage Vth of the PMOS transistor PT150 is assumed to be set at substantially the same level as the output signal 1stcomp of the first amplifier 110 that is generated immediately before the beginning of inversion of the output signal 2ndOUT from the second amplifier 120. The threshold voltage Vth of the PMOS transistor PT150 needs to be higher in level than the inversion start voltage Vstart.

<Operation of Comparator according to Present Technology>

Figure 11:
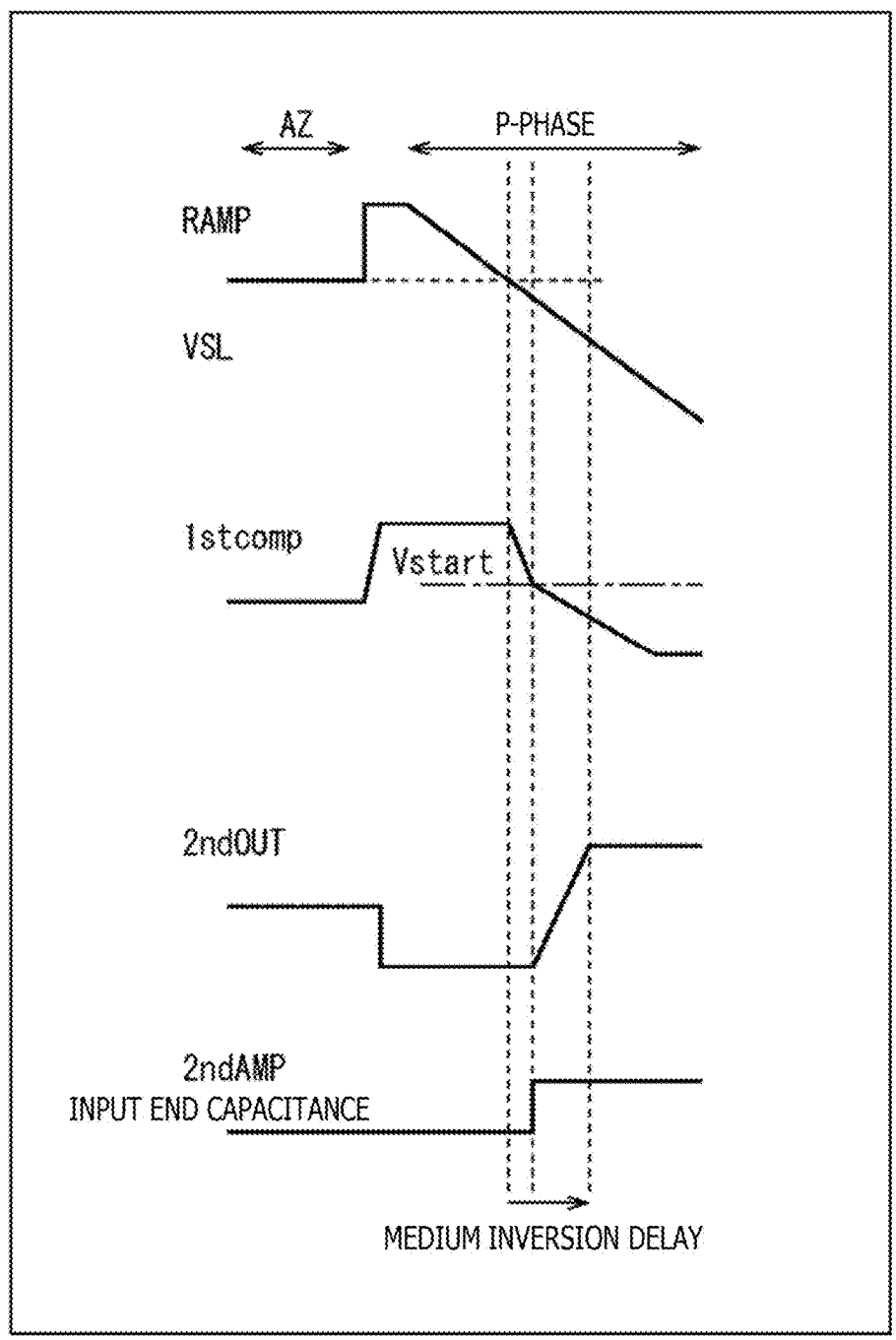
FIG. 11 is a timing diagram illustrating an operation of the comparator according to the present technology.

FIG. 11 is a timing diagram illustrating an operation of the comparator 31 depicted in FIG. 9.

FIG. 11 also does not depict a timing diagram of the D-phase period, but depicts a timing diagram of the AZ period and the P-phase period.

As depicted in FIG. 11, the PMOS transistor PT150 incorporated as a band-limiting capacitor in the comparator 31 changes the level of the output signal 1stcomp from high to low. When the output signal 1stcomp reaches substantially the same level as the inversion start voltage Vstart (threshold voltage Vth), the capacitance value of the PMOS transistor PT150 (an effective capacitance value at the input end of the second amplifier 120) increases. This suppresses an increase in the inversion delay while reducing the noise.

The capacitance characteristics of the PMOS transistor PT150 are such that the capacitance value of the PMOS transistor PT150 remains great after an inversion operation. Therefore, it is preferable that the voltage fluctuation direction in the output signal 1stcomp of the first amplifier 110 be in a high-to-low level direction. Alternatively, however, such voltage fluctuation direction may be in the reverse direction.

As described above, the configuration of the comparator 31 according to the present technology solves the trade-off between noise and inversion delay, as is the case with the configuration of the comparator 100C depicted in FIG. 7, which uses the Miller effect.

Incidentally, if, for example, many ADCs, such as column ADCs, simultaneously operate, supplied power fluctuates.

Figure 12:
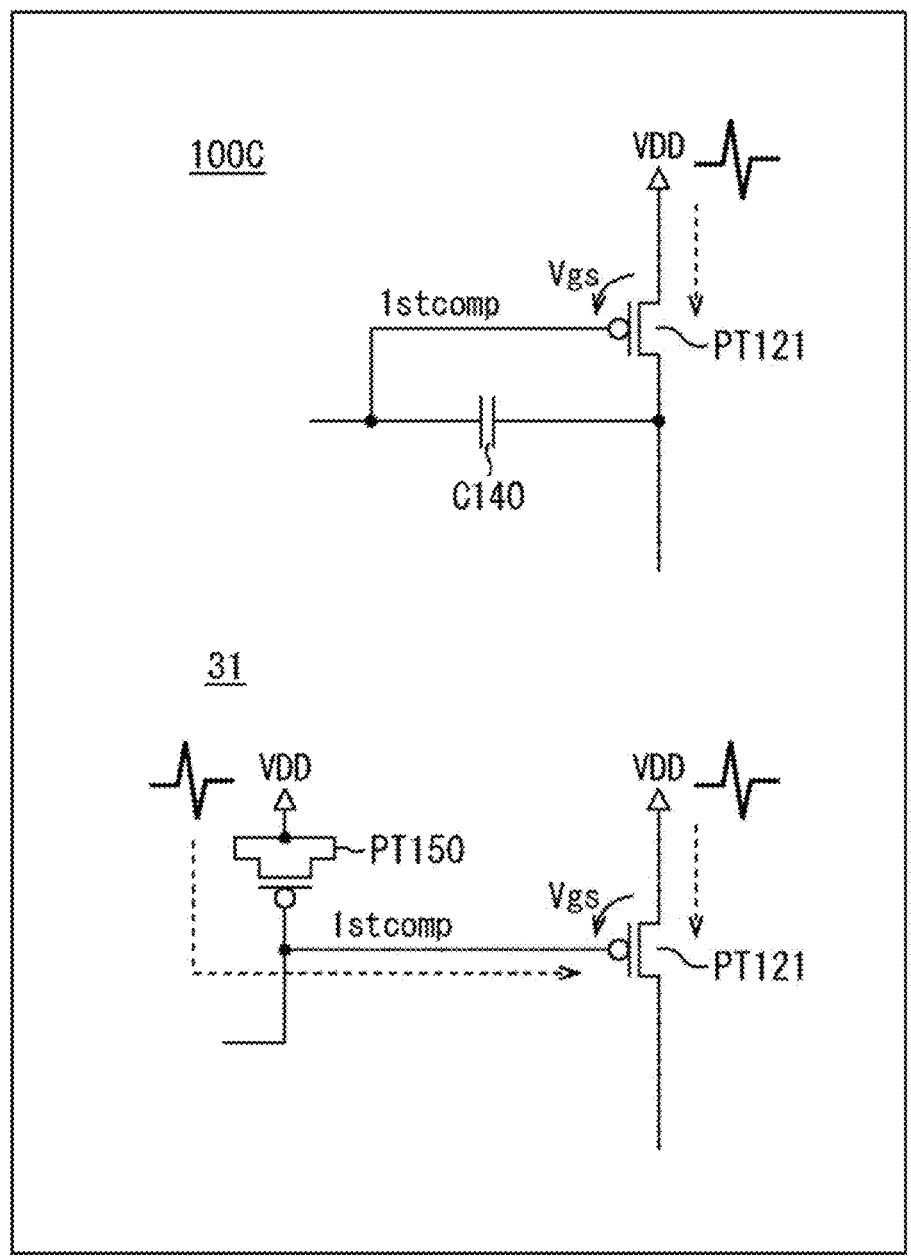
FIG. 12 is a diagram illustrating the influence of power fluctuation noise.

In the above instance, the comparator 100C is configured so that noise caused by the fluctuation of supplied power is inputted to the source of the PMOS transistor PT121 as indicated in the upper half of FIG. 12. This fluctuates the gate-source voltage Vgs, superimposing noise over the output signal 2ndOUT of the second amplifier 120. Consequently, the AD conversion results are in error. Particularly, the larger the number of simultaneously operating comparators, the greater the degree of fluctuation and thus the greater the error in the AD conversion results.

Meanwhile, the comparator 31 according to the present technology is configured so that noise caused by the fluctuation of supplied power is not only inputted to the source of the PMOS transistor PT121 but also inputted to the gate of the PMOS transistor PT121 through the PMOS transistor PT150, as indicated in the lower half of FIG. 12. Therefore, the fluctuation of the gate-source voltage Vgs is relatively reduced to suppress the noise from being superimposed over the output signal 2ndOUT of the second amplifier 120. As a result, the occurrence of an error in AD conversion results is suppressed. Particularly, even when significant fluctuation occurs due to a large number of simultaneously operating comparators, it is possible to suppress the occurrence of an error in the AD conversion results.

As described above, the present technology is configured to not only solve the trade-off between noise and inversion delay but also suppress the occurrence of an error in the AD conversion results.

<Alternative Configuration of Comparator According to Present Technology>

Figure 13:
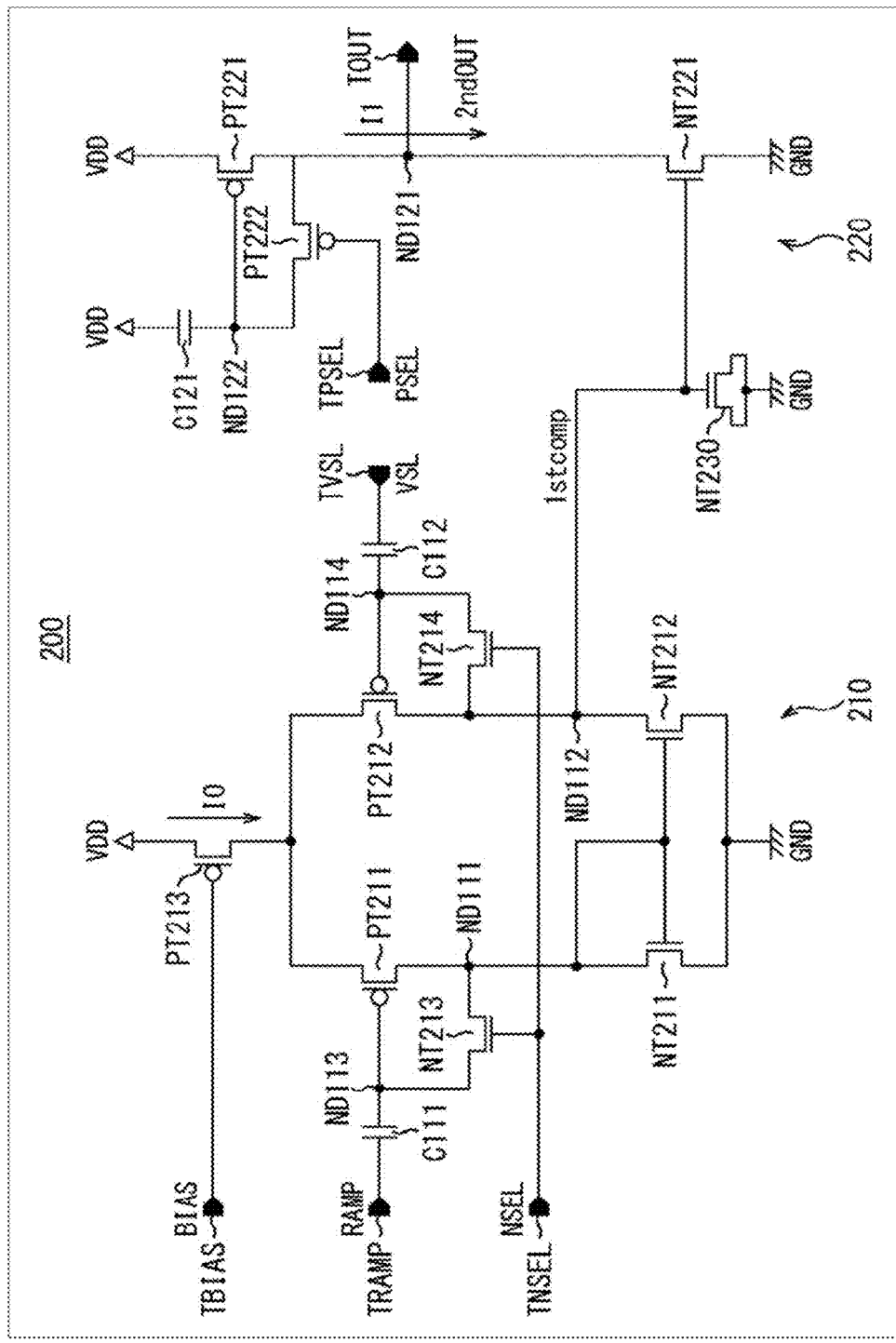
FIG. 13 is a circuit diagram illustrating another exemplary configuration of the comparator according to the present technology.

FIG. 13 is a circuit diagram illustrating another exemplary configuration of the comparator according to the present technology.

A comparator 200 depicted in FIG. 13 is obtained by reversing the polarities of the transistors for the comparator 31 depicted in FIG. 9. Thus, the connected power supply potential and ground potential are interchanged in the circuit. For ease of understanding, the reference symbols of nodes and capacitors in FIG. 13 are the same as those in FIG. 9.

As depicted in FIG. 13, the comparator 200 includes a first amplifier 210, a second amplifier 220, and an NMOS transistor NT230. The first amplifier 210 and the second amplifier 220 are cascaded.

In the first amplifier 210, the differential pair and the current source are configured by using PMOS transistors PT211 to PT213 instead of the NMOS transistors NT111 to NT113 depicted in FIG. 9. The source of the PMOS transistor PT213, which acts as the current source, is connected to the power supply potential VDD.

Further, the current mirror circuit is configured by using NMOS transistors NT211 and NT212 instead of the PMOS transistors PT111 and PT112 depicted in FIG. 9. The sources of the NMOS transistors NT211 and NT212 are connected to the ground potential GND.

Furthermore, the AZ switch is configured by using NMOS transistors NT213 and NT214 instead of the PMOS transistors PT113 and PT114 depicted in FIG. 9. In this case, the second AZ signal NSEL is supplied to the gates of the NMOS transistors NT213 and NT214 in the first amplifier 210.

In the second amplifier 220, the input end and the amplifier circuit are formed by using an NMOS transistor NT221 instead of the PMOS transistor PT121 depicted in FIG. 9. The source of the NMOS transistor NT221 is connected to the ground potential GND.

A transistor configuration forming a mirror circuit is employed by using a PMOS transistor PT221 instead of the NMOS transistor NT121 depicted in FIG. 9. The source of the PMOS transistor PT221 is connected to the power supply potential VDD.

Moreover, the first electrode of the capacitor C121 is connected to the node ND122, which is connected to the gate of the PMOS transistor PT221, and the second electrode is connected to the power supply potential VDD.

Additionally, the AZ switch is configured by using a PMOS transistor PT222 instead of the NMOS transistor NT122 depicted in FIG. 9. In this case, the first AZ signal PSEL is supplied to the gate of the PMOS transistor PT222 in the second amplifier 220.

Meanwhile, the NMOS transistor NT230 is connected as a band-limiting capacitor between the output node ND112 of the first amplifier 210 and the ground potential GND.

The NMOS transistor NT230 has an opposite polarity to the differential pair that is formed by the PMOS transistors PT211 and PT212 in the first amplifier 210. That is to say, the NMOS transistor NT230 has the same polarity as the NMOS transistor NT221, which acts as the input end of the second amplifier 220.

The gate of the NMOS transistor NT230 is connected to the output node ND112 of the first amplifier 210. The source and the drain of the NMOS transistor NT230 are connected to the ground potential GND.

FIG. 14 is a diagram illustrating the capacitance characteristics of an NMOS transistor.

As depicted in FIG. 14, the capacitance value of the NMOS transistor is small when the input voltage is low, that is, when the gate-source voltage Vgs is low. However, when the input voltage is raised to let the gate-source voltage Vgs exceed the threshold voltage Vth, the capacitance value of the NMOS transistor sharply increases.

The above characteristics and a low-to-high level change in the output signal 1stcomp of the first amplifier 210 can be used to increase the capacitance value of the band-limiting capacitor at approximately the beginning of inversion of the output signal 2ndOUT from the second amplifier 220. In this instance, the threshold voltage Vth of the NMOS transistor NT230 is assumed to be set at substantially the same level as the output signal 1stcomp of the first amplifier 210 that is generated immediately before the beginning of inversion of the output signal 2ndOUT from the second amplifier 220. The threshold voltage Vth of the NMOS transistor NT230 needs to be lower in level than the inversion start voltage Vstart.

The comparator 200, having such a configuration, depicted in FIG. 13 performs basically the same operation as the comparator 31 depicted in FIG. 9. However, the waveforms of RAMP, 1stcomp, and 2ndAmp depicted in the timing diagram of FIG. 11 are reversed.

The comparator 200 depicted in FIG. 13 provides the same advantages as the comparator 31 depicted in FIG. 9.

More specifically, the comparator 200 depicted in FIG. 13 is configured so that noise caused by GND fluctuation is not only inputted to the source of the NMOS transistor NT221 but also inputted to the gate of the NMOS transistor NT221 through the NMOS transistor NT230. Therefore, the fluctuation of the gate-source voltage Vgs is relatively reduced to suppress the noise from being superimposed over the output signal 2ndOUT of the second amplifier 220. As a result, the occurrence of an error in AD conversion results is suppressed.

The present technology is not only applicable to solid-state imaging devices, but also applicable to various other imaging devices. The various other imaging devices include a camera system, such as the systems for a digital still camera and a digital video camera, and an electronic apparatus having an imaging function, as such a mobile phone. A module incorporated in such an electronic apparatus, that is, a camera module, may be regarded as an imaging device.

<Exemplary Configuration of Electronic Apparatus>

Figure 15:
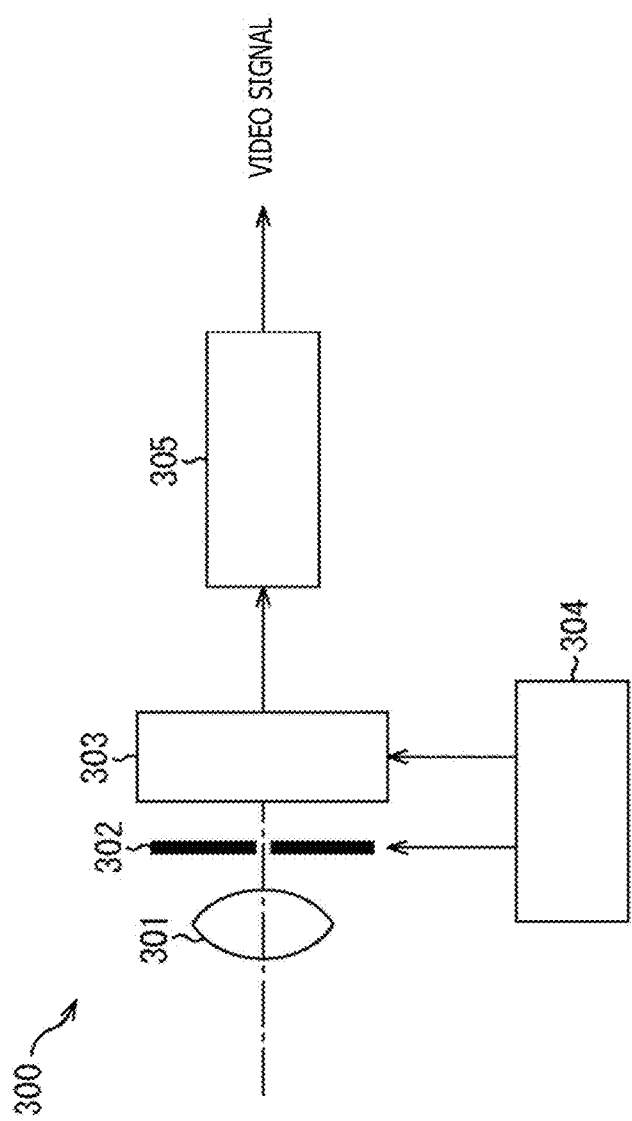
FIG. 15 is a block diagram illustrating an exemplary configuration of an electronic apparatus according to the present technology.

Referring to FIG. 15, the following describes an exemplary configuration of an electronic apparatus to which the present technology is applied.

An electronic apparatus 300 depicted in FIG. 15 includes an optical lens 301, a shutter device 302, a solid-state imaging device 303, a drive circuit 304, and a signal processing circuit 305. The description given with reference to FIG. 15 describes an embodiment in which the solid-state imaging device 1 according to the present technology is incorporated as the solid-state imaging device 303 in the electronic apparatus (digital still camera).

The optical lens 301 forms an image of image light (incident light), which is received from an object, on the image plane of the solid-state imaging device 303. Thus, a signal charge is stored in the solid-state imaging device 303 for a fixed period of time. The shutter device 302 controls a light irradiation period and a light-shielding period for the solid-state imaging device 303.

The drive circuit 304 supplies a drive signal to the shutter device 302 and to the solid-state imaging device 303. The drive signal supplied to the shutter device 302 is a signal for controlling a shutter operation of the shutter device 302. The drive signal supplied to the solid-state imaging device 303 is a signal for controlling a signal transfer operation of the solid-state imaging device 303. The solid-state imaging device 303 transfers a signal in accordance with the drive signal (timing signal) supplied from the drive circuit 304. The signal processing circuit 305 performs various types of signal processing on a signal output from the solid-state imaging device 303. A video signal on which signal processing is performed is stored in a storage medium such as a memory or outputted to a monitor.

The electronic apparatus 300 according to the present embodiment, in the solid-state imaging device 303, suppresses the occurrence of an error in the AD conversion results. This makes it possible to provide an electronic apparatus that is capable of acquiring a high-quality image.

<Exemplary Uses of Image Sensor>

Finally, the following description describes exemplary uses of the image sensor to which the present technology is applied.

Figure 16:
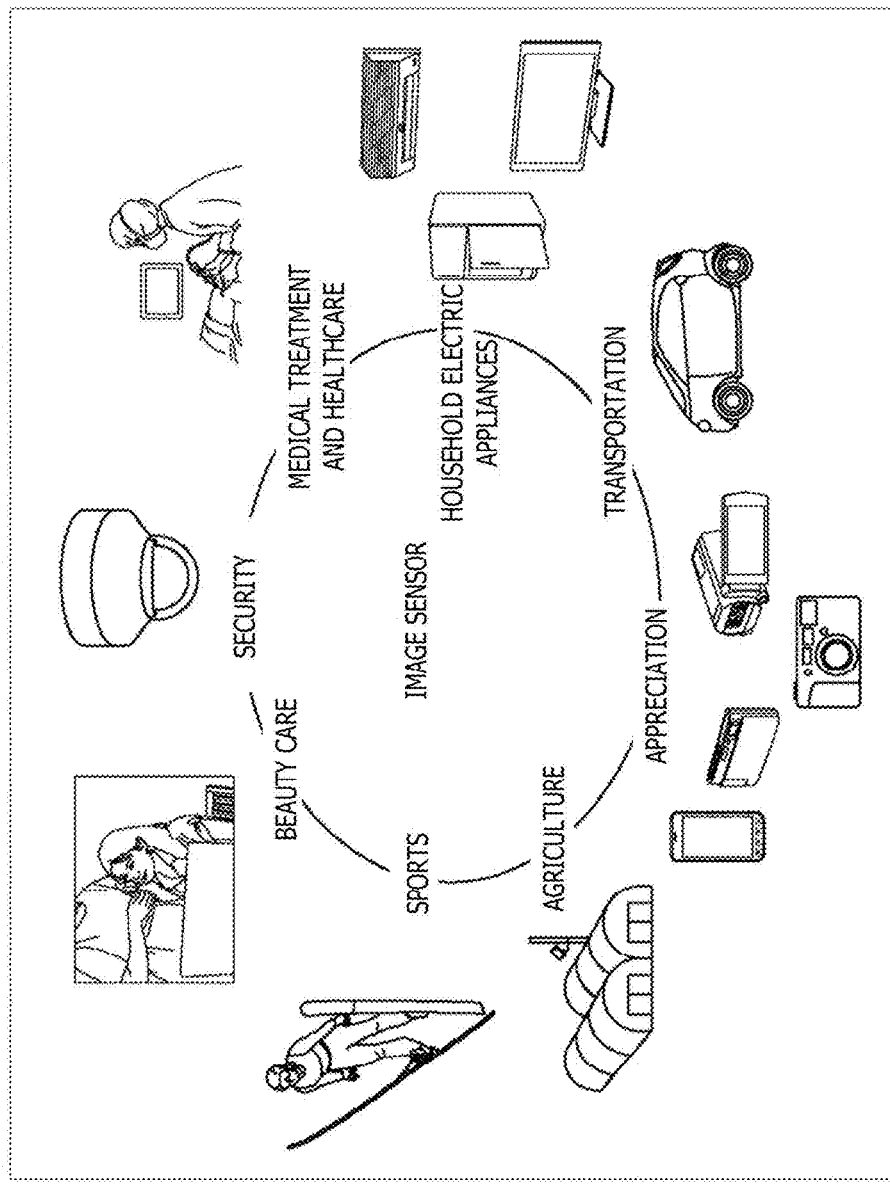
FIG. 16 is a diagram illustrating exemplary uses of an image sensor.

FIG. 16 is a diagram illustrating the exemplary uses of the above-described image sensor.

The above-described image sensor can be used, for example, in following various cases where visible light, infrared light, ultraviolet light, X-ray light, or other light is to be sensed as indicated below.

- A device for capturing an image used for appreciation, such as a digital camera or a mobile device with a camera function.
- A device used, for example, to provide an automatic stop feature and other safety driving features and recognize the status of a driver of a vehicle during transportation, such as a vehicle-mounted sensor for capturing an image showing, for instance, a forward or rearward view from a vehicle, a view around the vehicle, or the interior of the vehicle, a monitoring camera for monitoring traveling vehicles and roads, or a distance sensor for measuring, for example, an inter-vehicle distance.
- A device used with a television set (TV), a refrigerator, an air conditioner, or other household electric appliance in order to capture an image of a user's gesture and operate such an electric appliance in accordance with the gesture.
- A device used with an endoscope, an angiographic instrument adapted to receive infrared light, or other medical treatment or healthcare instrument.
- A device used for security purposes, such as a monitoring camera for crime prevention or a camera for personal authentication.

A device used for beauty care, such as a skin measuring instrument for capturing an image of skin or a microscope for capturing an image of a scalp.

A device used for sports, such as an action camera or a wearable camera for sporting and other events.

A device used for agriculture, such as a camera for monitoring the status of farms and farm products.

Embodiments of the present technology are not limited to the foregoing embodiments. The foregoing embodiments may be variously modified without departing from the spirit and scope of the present technology.

Further, the present technology may adopt the following configurations.

(1) A solid-state imaging device including:
a pixel section that has a plurality of pixels;
a comparator that compares a pixel signal outputted from the pixels with a reference signal; and
a counter that counts a time of comparison made by the comparator,
wherein the comparator includes
a first amplifier that compares the pixel signal with the reference signal,
a second amplifier that has a first transistor and amplifies an output signal of the first amplifier, and
a second transistor that has the same polarity as the first transistor,
a gate of the second transistor is connected to an output node of the first amplifier, and
a source and a drain of the second transistor are connected to the same fixed potential as a source of the first transistor.

(2) The solid-state imaging device as described in (1) above, wherein, when the second transistor is a PMOS transistor, the source and the drain of the second transistor are connected to a power supply potential.

(3) The solid-state imaging device as described in (1) above, wherein, when the second transistor is an NMOS transistor, the source and the drain of the second transistor are connected to a ground potential.

(4) The solid-state imaging device as described in any one of (1) to (3) above, wherein a threshold voltage of the second transistor is set at substantially the same level as an output signal that is generated from the first amplifier immediately before a start of inversion of the second amplifier.

(5) An electronic apparatus including:
a solid-state imaging device,
wherein the solid-state imaging device includes
a pixel section that has a plurality of pixels,
a comparator that compares a pixel signal outputted from the pixels with a reference signal, and
a counter that counts a time of comparison made by the comparator,
the comparator includes
a first amplifier that compares the pixel signal with the reference signal,
a second amplifier that has a first transistor and amplifies an output signal of the first amplifier, and
a second transistor that has the same polarity as the first transistor,
a gate of the second transistor is connected to an output node of the first amplifier, and
a source and a drain of the second transistor are connected to the same fixed potential as a source of the first transistor.

(6) An AD converter including:
a comparator that compares an analog signal with a reference signal and amplifies a result of comparison; and
a counter that counts a time of comparison made by the comparator,
wherein the comparator includes
a first amplifier that compares the analog signal with the reference signal,
a second amplifier that has a first transistor and amplifies an output signal of the first amplifier, and
a second transistor that has the same polarity as the first transistor,
a gate of the second transistor is connected to an output node of the first amplifier, and
a source and a drain of the second transistor are connected to the same fixed potential as a source of the first transistor.

REFERENCE SIGNS LIST

1 Solid-state imaging device, 11 Pixel section, 15 ADCs, 31 Comparator, 32 Counter, 33 Latch, 51 Pixel, 110 First amplifier, 120 Second amplifier, PT150 PMOS transistor, 200 Comparator, 210 First amplifier, 220 Second amplifier, NT230 NMOS transistor, 300 Electronic apparatus, 303 Solid-state imaging device

What is claimed is:

1. An imaging device comprising:
a plurality of pixels including a pixel configured to receive incident light and output an analog signal;
a plurality of signal lines including a signal line coupled to the pixel; and
a plurality of comparators, wherein a comparator of the plurality of comparators includes:
a first amplifier that includes a first transistor configured to receive a signal based on the analog signal and a second transistor configured to receive a reference signal;
a second amplifier that includes a third transistor configured to receive an output from an output node of the first amplifier; and
a fourth transistor having a gate coupled between the output node of the first amplifier and the third transistor, and a source and a drain coupled to a ground potential.

2. The imaging device of claim 1, wherein the first amplifier further includes a fifth transistor coupled to the ground potential.

3. The imaging device of claim 2, wherein the third transistor is coupled to the ground potential.

4. The imaging device of claim 3, wherein a gate of the third transistor is configured to receive the output from the output node of the first amplifier.

5. The imaging device of claim 1, wherein a polarity of the fourth transistor is opposite to a polarity of at least one of the first transistor and the second transistor.

6. The imaging device of claim 1, wherein a polarity of the fourth transistor and a polarity of the third transistor are the same.

7. The imaging device of claim 1, wherein the fourth transistor is configured to have a capacitance value that varies depending on the output from the output node of the first amplifier.

8. The imaging device of claim 1, wherein the fourth transistor is configured to have a capacitance value that varies depending on a voltage between the gate of the fourth transistor and the source of the fourth transistor.

9. The imaging device of claim 8, wherein the capacitance value of the fourth transistor increases in response to the voltage between the gate of the fourth transistor and the source of the fourth transistor exceeding a threshold voltage.

10. The imaging device of claim 9, wherein the threshold voltage is greater than or equal to an inversion voltage that corresponds to a level of the output in response to a second output signal of the second amplifier being inverted.

11. An imaging device comprising:
a plurality of pixels including a pixel configured to receive incident light and output an analog signal;
a plurality of signal lines including a signal line coupled to the pixel; and
a plurality of comparators, wherein a comparator of the plurality of comparators includes:
a first amplifier that includes a first transistor configured to receive a signal based on the analog signal and a second transistor configured to receive a reference signal;
a second amplifier that includes a third transistor configured to receive an output from an output node of the first amplifier; and
a fourth transistor having a gate coupled to the first amplifier and the third transistor, and a source and a drain coupled to a potential.

12. The imaging device of claim 11, wherein the potential is a ground potential or a power supply potential.

13. The imaging device of claim 11, wherein the first amplifier further includes a fifth transistor coupled to a power supply potential.

14. The imaging device of claim 13, wherein the third transistor is coupled to the power supply potential.

15. The imaging device of claim 14, wherein a gate of the third transistor is configured to receive the output from the output node of the first amplifier.

16. The imaging device of claim 11, wherein a polarity of the fourth transistor is opposite to a polarity of at least one of the first transistor and the second transistor.

17. The imaging device of claim 11, wherein a polarity of the fourth transistor and a polarity of the third transistor are the same.

18. The imaging device of claim 11, wherein the fourth transistor is configured to have a capacitance value that varies depending on the output from the output node of the first amplifier.

19. The imaging device of claim 11, wherein the fourth transistor is configured to have a capacitance value that varies depending on a voltage between the gate of the fourth transistor and the source of the fourth transistor.

20. The imaging device of claim 19, wherein the capacitance value of the fourth transistor increases in response to the voltage between the gate of the fourth transistor and the source of the fourth transistor exceeding a threshold voltage.

21. The imaging device of claim 20, wherein the threshold voltage is greater than or equal to an inversion voltage that corresponds to a level of the output in response to a second output signal of the second amplifier being inverted.

22. An electronic apparatus comprising:
an optical imaging system; and
an imaging device comprising:
a plurality of pixels including a pixel configured to receive light from the optical imaging system and output an analog signal;
a plurality of signal lines including a signal line coupled to the pixel; and
a plurality of comparators, wherein a comparator of the plurality of comparators includes:
a first amplifier that includes a first transistor configured to receive a signal based on the analog signal and a second transistor configured to receive a reference signal;
a second amplifier that includes a third transistor configured to receive an output from an output node of the first amplifier; and
a fourth transistor having a gate coupled between the output node of the first amplifier and the third transistor, and a source and a drain coupled to a potential.

23. The electronic apparatus of claim 22, wherein the potential is a power supply potential or a ground potential.

24. The electronic apparatus of claim 22, wherein the first amplifier further includes a fifth transistor coupled to the potential.

25. The electronic apparatus of claim 24, wherein the third transistor is coupled to the potential.

26. The electronic apparatus of claim 25, wherein a gate of the third transistor is configured to receive the output from the output node of the first amplifier.

27. The electronic apparatus of claim 22, wherein a polarity of the fourth transistor is opposite to a polarity of at least one of the first transistor and the second transistor.

28. The electronic apparatus of claim 22, wherein a polarity of the fourth transistor and a polarity of the third transistor are the same.

29. The electronic apparatus of claim 22, wherein the fourth transistor is configured to have a capacitance value that varies depending on the output from the output node of the first amplifier.

30. The electronic apparatus of claim 22, wherein the fourth transistor is configured to have a capacitance value that varies depending on a voltage between the gate of the fourth transistor and the source of the fourth transistor.

31. The electronic apparatus of claim 30, wherein the capacitance value of the fourth transistor increases in response to the voltage between the gate of the fourth transistor and the source of the fourth transistor exceeding a threshold voltage.

32. The electronic apparatus of claim 31, wherein the threshold voltage is greater than or equal to an inversion voltage that corresponds to a level of the output in response to a second output signal of the second amplifier being inverted.

* * * * *